United States Patent [19]
Glassman

[11] 4,044,248
[45] Aug. 23, 1977

[54] METHOD AND APPARATUS FOR LINEARIZING A MIRROR GALVANOMETER

[75] Inventor: David M. Glassman, Rochester, N.Y.
[73] Assignee: Eastman Kodak Company, Rochester, N.Y.
[21] Appl. No.: 413,465
[22] Filed: Nov. 7, 1973

Related U.S. Application Data

[63] Continuation-in-part of Ser. No. 249,922, May 3, 1972, abandoned.

[51] Int. Cl.² .................... G01J 1/20; G01R 13/38; G01R 13/40
[52] U.S. Cl. ................................. 250/201; 324/97
[58] Field of Search ................ 324/97, 132, 123 C; 250/201

[56] References Cited

U.S. PATENT DOCUMENTS

| | | | |
|---|---|---|---|
| 2,883,649 | 4/1959 | King, Jr. ............................. | 324/97 |
| 2,896,164 | 7/1959 | Bizouard et al. .................. | 324/97 X |
| 3,029,387 | 4/1962 | Moe .................................... | 324/97 |

OTHER PUBLICATIONS

Anonymous, "Method and Apparatus for Linearizing a Mirror Galvanometer," *Research Disclosure*, pp. 54–56, Oct. 1972.

*Primary Examiner*—Alfred E. Smith
*Assistant Examiner*—T. N. Grigsby
*Attorney, Agent, or Firm*—John D. Husser

[57] ABSTRACT

Method and apparatus for linearizing the response of a mirror galvanometer or the like to a reference driving signal. An optical assembly transmits through a transmission grating a scanned light beam deflected from a reference signal driven galvanometer mirror. The beam passing through the grating is modulated thereby and received by a photocell. The transmission grating modulates the scanned beam in accordance with the velocity of scan of the light beam and the photocell produces an output signal having a freqency content corresponding to the velocity of the beam. An electrical circuit, in response to the frequency content of the photocell output signal, produces a control signal which is combined with the reference driving signal and applied to the galvanometer to deflect the galvanometer mirror in a manner linearly related to the reference driving signal.

3 Claims, 6 Drawing Figures

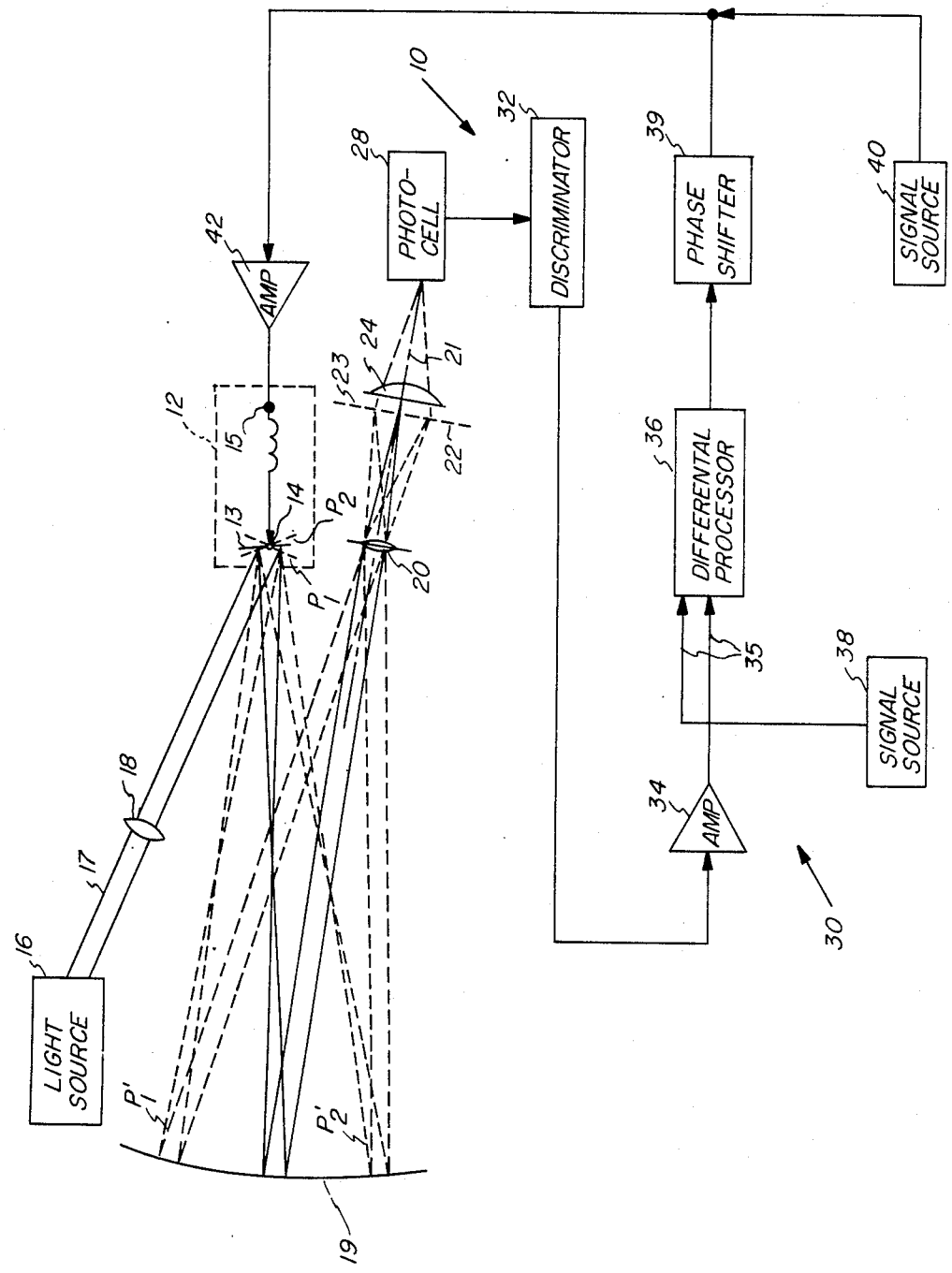

METHOD AND APPARATUS FOR LINEARIZING A MIRROR GALVANOMETER

This application is a continuation-in-part of pending U.S. Ser. No. 249,922, filed May 3, 1972 and now abandoned.

BACKGROUND OF THE INVENTION

1. Field of the Invention

The present invention relates generally to an optical scanning apparatus and method and more particularly to an apparatus and method for linearizing the response of a mirror galvanometer to a reference signal.

2. Description of the Prior Art

Mirror galvanometers utilize a small mirror carried by a coil in a magnetic field. The mirror deflects a light beam incident thereon in a scan related to the amount of current flowing through the coil. The angle to which the light beam is deflected changes in response to small changes in the electrical current.

It is frequently desirable that the rate of scan of a galvanometer be linearly related to a small reference or driving current or voltage. Such a situation would be one where an instantaneously accurately positioned scanning light beam is sought for purposes of reading or writing.

In an ideal mirror galvanometer the current through the coil should cause mirror deflection in an amount linearly related to the magnitude of the coil current. However, because of such factors as non-uniform magnetic fields, variable galvanometer damping coefficients, such as those due to temperature effects caused by variable energy dissipation rates, self resonances within galvanometer systems, and the like, galvanometer mirrors do not deflect in a manner linearly related to the coil current.

SUMMARY OF THE INVENTION

In accordance with the present invention, there is provided a feedback system for linearizing the response of a scanning device such as a mirror galvanometer. A light beam is directed onto the mirror as it moves in response to a reference driving signal applied to the coil of the galvanometer to scan the beam. The scanning beam is received and modulated in accordance with the velocity of the beam. A useful method of so modulating the beam is to cause it to scan an optical transmission grating. A photoresponsive device is disposed to receive the modulated beam and produces an electrical feedback signal having a frequency characteristic related to the modulation of the light received. An electrical circuit is provided for adjusting the signal driving the mirror in response to the feedback signal to effect the scan at a predetermined rate.

The electrical circuitry for producing an adjusted driving signal first produces a difference signal in accordance with the frequency characteristic of the output signal. The difference signal has a magnitude related to the difference between the actual velocity of the light scan and the velocity that would exist if the response of the movable member was truly linear in relation to the reference driving signal. The difference signal is combined with the reference driving signal and the combined driving signal is applied to the coil of the galvanometer to effect movement of the mirror in a manner so as to produce a linear relation between the deflection position of the mirror and the amplitude of the reference driving signal.

Thus, one object of this invention is to provide an improved apparatus and method for scanning a light beam at a predetermined rate.

Another object of this invention is to cause the response of a movable optical member, such as a mirror galvanometer, to vary in a manner linearly related to the amplitude of a reference driving signal.

Another object of this invention is to linearize the response of a conventional mirror galvanometer without modification to the galvanometer itself.

Another object of the invention is to provide a simple and economical apparatus for linearizing the response of a mirror galvanometer.

Another object of this invention is to linearize the motion of a galvanometer without sensitivity to intensity variations of the light beam that is used to sense the motion of the galvanometer or to variations in ambient conditions such as temperature.

BRIEF DESCRIPTION OF THE DRAWINGS

Further objects and advantages of the instant invention will become more apparent in the detailed description of the invention with reference to the accompanying drawings in which like numbers denote like parts and wherein:

FIG. 1 is a diagrammatic illustration, partly in block form, illustrating schematically a mirror galvanometer and apparatus in accordance with the present invention for linearizing the response of the galvanometer relative to a reference driving signal;

DESCRIPTION OF THE PREFERRED EMBODIMENT

Because mirror galvanometers are well known, the present description will be directed in particular to elements forming part of, or cooperating directly with a typical mirror galvanometer in accordance with the present invention. It will be appreciated that elements not specifically shown or described may take various forms well known to those skilled in the art.

The terms "light" and "mirror" are used herein for simplicity of description, it will be understood that these terms apply to any deflectable radiation and any radiation deflector, respectively.

Figure 2A:
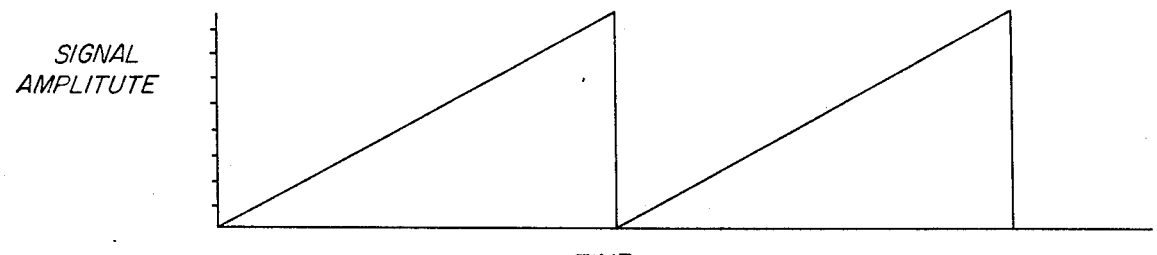
FIG. 2(a) illustrates a representative time varying reference driving signal.
Figure 2B:
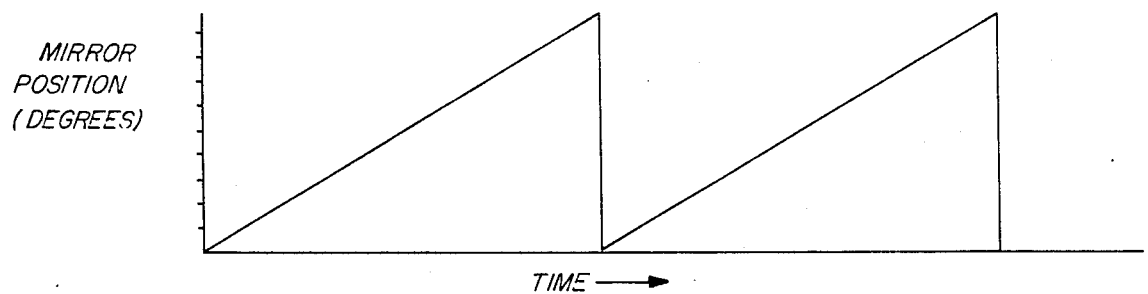
FIG. 2(b) illustrates graphically an ideal angular deflection of the galvanometer in response to a linear reference driving signal such as the signal shown in FIG. 2(a)
Figure 2C:
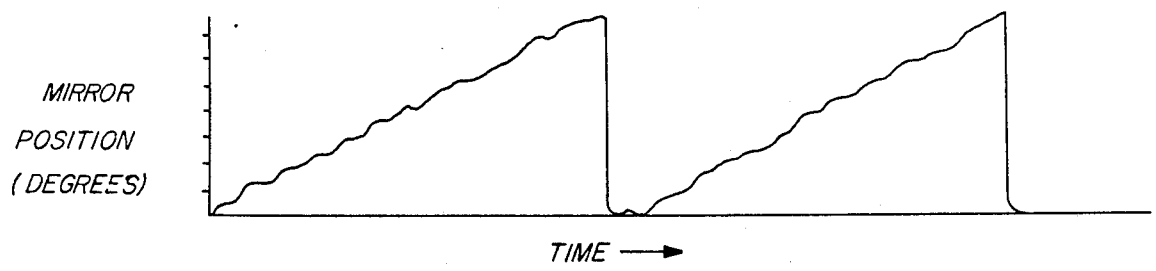
FIG. 2(c) illustrates an actual angular deflection of a conventional galvanometer without the linearizing apparatus of the subject invention when the galvanometer is driven by the signal shown in FIG. 2(a)

Referring to FIG. 1 of the drawings, there is shown apparatus, denoted generally 10, adapted for linearizing the response of a galvanometer 12 having a mirror 13 rotatably supported on a shaft 14. Also shown in conjunction with galvanometer 12 is a coil 15 which controls the deflection of mirror 13 in a manner related to the amplitude of a reference driving signal applied thereto. Such a signal is illustrated in FIG. 2(a). It should be noted that some time must be given for a galvanometer to return to its starting position after completion of a scan, which time is not shown on any of FIGS. 2(a), 2(b) and 2(c), such figures being illustrative of only the driving portion of the galvanometer's operating cycle.

Shown in block form in FIG. 1 is a light source 16 for producing a collimated beam of light 17. The light produced by light source 16 is collimated into a relatively narrow beam by known optical elements, which may be included in the source. Source 16 can be a laser, projector bulb and lens, or other such well known light sources. Positioned along the optical axis of light beam 17 is lens 18 which focuses the light from beam 17 at the focal surface of a stationary spherical mirror 19.

Lens 18 is positioned to direct light beam 17 first onto mirror 13 of galvanometer 12. Mirror 13 is rotatably supported on shaft 14 so that as mirror 13 moves from position $P_1$ to $P_2$, beam 17 is scanned across the face of mirror 19 in a path from position $P_1'$ to position $P_2'$ in a manner related to the reference or driving signal applied to coil 15.

Spherical mirror 19 is positioned to collimate and deflect the scanning beam 17 incident thereon through a lens 20 having an optical axis 21. A transmission grating 22 is disposed upon and preferably centered on axis 21 and positioned substantially in the focal plane of lens 20. In its preferred embodiment, grating 22 comprises a transparent material such as glass having a large number of substantially equally spaced grid lines or rulings only a few of which are symbolically shown in FIG. 1 as apertures 23. Grating 22 modulates the light beam 17 for a purpose explained below.

Also centered on axis 21 is a collector lens 24 which focuses the modulated light onto a photoresponsive member 28, such as a photocell, for producing an electrical signal. The rulings 23 are preferably substantially perpendicular to the direction of scan of the beam 17 but can be at any angle greater than 0° sufficient to effect a periodic modulation of the beam. A smaller angle will be effective with fine, closely spaced rulings. The frequency is related directly to the effective spacing between adjacent grid lines or rulings 23 on grating 22 and the scan rate or velocity of beam 17 (the effective spacing being approximately equal to the sine of the angle between the direction of scan and the direction of the rulings). If light beam 17 is scanned across the rulings 23 of grating 22 at a constant rate in one or the other direction, then the frequency content of the electrical output signal produced by photocell 28 will consist of only a fundamental or carrier frequency. If, however, the scan rate of beam 17 deviates from a constant rate, the frequency content of the photocell output signal will vary in accordance with the deviation from the fundamental frequency.

Electrically coupled to the output of photocell 28 is an electrical system, denoted generally 30, for processing the output signal of the photocell to produce a signal for linearizing the deflection angle of mirror galvanometer 12 relative to the amplitude of a time variant reference driving signal, such as that illustrated in FIG. 2(a). The embodiment of system 30 illustrated in FIG. 1 comprises a conventional frequency discriminator 32 electrically connected to the output of photocell 28. Discriminator 32 produces a signal having a magnitude proportional to the frequency content of its input signal. The output of discriminator 32 is connected to an amplifier 34, which amplifies the signal to a level that is compatable with the other electrical elements in the system. The output of amplifier 34 is connected to one of two inputs 35 of a differential processor 36 which may be, for example, a differential integrator. Connected to the second of inputs 35 of processor 36 is a signal source 38 which produces a second reference signal explained below, that is compared by the differential processor to the output signal produced by amplifier 34.

The output of the discriminator 32 is a voltage that is proportional to the frequency of the voltage produced by photocell 28. The voltage is therefore proportional to the velocity of the scanner beam. The differential processor 36 can be a conventional integrator; with two inputs, and its output will be the integral of the weighted sum of the two inputs. By making the fixed reference voltage or reference signal from source 38 a negative voltage or signal, the output of the differential integrator 36, will be the integral of the difference between the velocity signal, i.e., the output of discriminator 32, and the second reference signal from source 38. When the signal from source 38 is of proper amplitude as described below, this voltage is proportional to the relative positional error of the scanned beam.

The outout of differential processor 36 is connected to a phase compensator circuit 39 which shifts the phase of the input signal applied thereto to compensate for any phase shifts that occur in the galvanometer drive signals due to resonant conditions therein. The output of phase compensator circuit 39 can be combined by conventional techniques with the output of signal source 40 and applied to the input of a conventional power amplifier 42. An example of a constant rate scan signal from driving signal source 40 is shown in FIG. 2(a). Amplifier 42 produces an output current in accordance with the input signals applied thereto, and this current is applied to the galvanometer coil 15 to deflect mirror 13 in accordance therewith.

The second reference voltage, produced by voltage source 38, has an amplitude equal to the voltage value that would be produced at the output of amplifier 34 if the scan rate of beam 17 were at the desired rate. In instances where the first reference signal or driving signal from source 40 is linear the desired beam scan rate is constant, so the second reference signal produced by source 38 has a constant amplitude. If, however, the first reference signal is non-linear, for example parabolically shaped, the beam scan rate is not constant and so, correspondingly, the frequency content of the photocell output signal would likewise be variable and thereby produce a discriminator output signal having a time varying amplitude. Consequently, for a first reference or driving signal of this type, the signal produced by source 38 has a variable amplitude related to the expected discriminator output signal. The amplitude of the second reference signal in either case would be related directly to the slope of the first reference signal.

If the photocell output signal has a frequency component equal to a known or predetermined value and that value is also equal to the second reference signal source 38, the galvanometer mirror is being deflected in the desired manner as determined by the output signal differential processor 36 being substantially zero.

Figure 3:
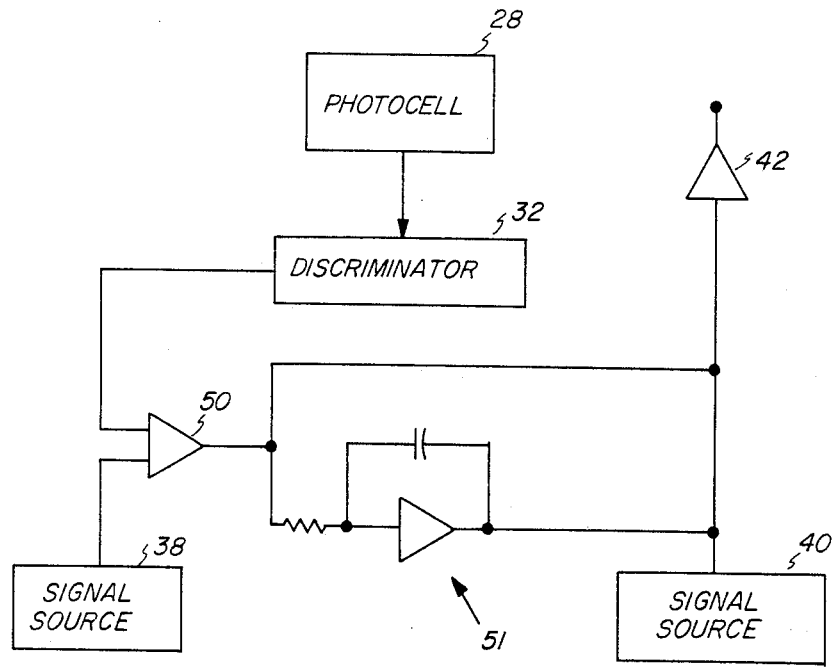
FIGS. 3 and 4 are diagrammatic illustrations of portions of alternate circuits usable in the apparatus shown in FIG. 1.

Another signal processing technique is shown in FIG. 3. Here the output of discriminator 32 is applied to the input of a differential amplifier 50. The reference signal 38 is applied to a second input of amplifier 50. The output of amplifier 50 is now a voltage proportional to the velocity error of the scanned beam. This signal is combined with the reference signal 40 by conventional techniques and applied directly to the input of amplifier 42 to provide improved response to the reference driving signal. This velocity error signal is also integrated by means of integrator 51 to provide a positional error signal which is also combined with the reference signal 40 by standard techniques and applied to the input of amplifier 42 to provide further improved linearity of the galvanometer.

Figure 4:
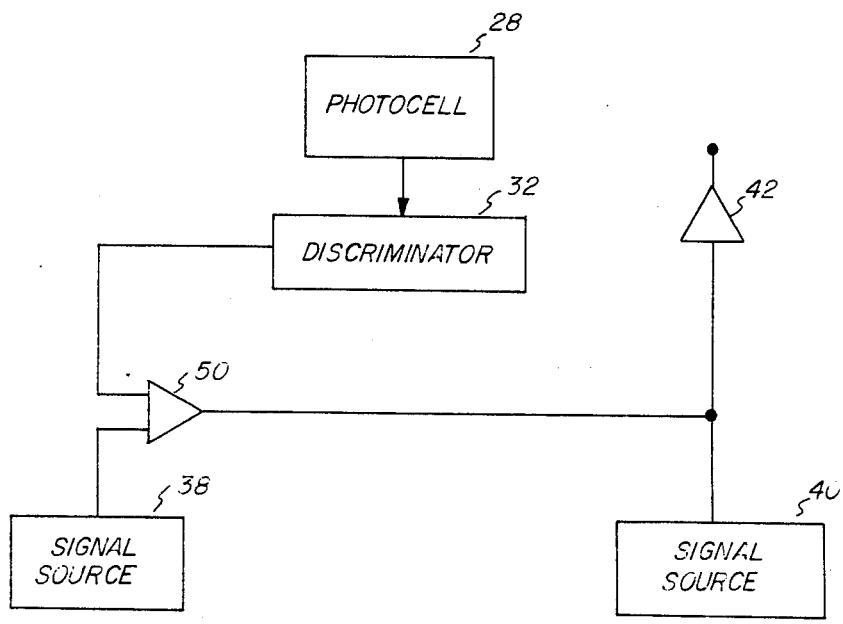

FIG. 4 illustrates the most simple form of this circuitry with the elimination of the integrator 51. This circuit gives a useful improvement in linearity but is somewhat less effective than the circuit of FIG. 3.

Amplifiers 50 and 51 should have standard reset circuits, not shown, to hold their outputs at zero during the retrace interval of the scan.

It is to be understood that in accordance with the invention, other electronic processing apparatus directed to the analysis of frequency modulated signals and the comparison of the results of this analysis to a known, predetermined or reference value can be used. One such alternative embodiment would be comprised of a bank of narrow band filters, each of such filters having a bandpass so that the resultant bandpass of the composite filter bank is continuous over a predetermined range. In this manner, the photocell output signal could be applied to the filter bank and that filter having the maximum signal output would determine the primary frequency content of the photocell signal, which, in turn, can be related as disclosed herein, to the deflection characteristics of the galvanometer.

Although described in connection with linearizing the response of a mirror galvanometer relative to the amplitude of a reference signal, the invention is also applicable to linearizing other types of optical scanning systems such as a rotating polygon of the line scanner type, a rotating lens, a line scan Cathode Ray Tube display and the like. Furthermore, the invention is not limited to linearizing responses of the above-mentioned scanning systems to a linear reference signal such as is shown in FIG. 2(a), but is applicable to linearizing such systems to a class of reference signals that can be described with continuous single valued functions wherein such functions have time varying characteristics consistent with the system dynamics of conventional movable optical members. Movement of members corresponding to such functions are effected at a predetermined rate in accordance with the invention.

I have found by applying a correction signal that is derived from the frequency content of the photocell signal, as disclosed herein, that an improvement in the linearity of the response of a convention mirror galvanometer to a reference signal of approximately 10 to 20 times that of an uncorrected galvanometer of an identical type is achieved. Such an improvement is illustrated symbolically in the curves of FIGS. 2(b) and 2(c). By applying such a correction signal in accordance with the invention to the coil of a conventional galvanometer, the deflection path of the regulated or controlled galvanometer can be made to substantially to follow the ideal curve illustrated in FIG. 2(b).

The invention has been described in detail with particular reference to a preferred embodiment thereof, but it will be understood that variations and modifications can be effected within the spirit and scope of the invention.

I claim:

1. In combination with scanning apparatus of the type having a radiation deflecting member mounted for movement to scan a beam of radiation along a path, means for providing an electrical primary drive signal, and means associated with said deflecting member and responsive to said primary drive signal for moving said deflecting member in a manner effecting scan of such radiation along said path at a generally-predetermined, actual rate, a device for effecting a more precise rate of radiation scan comprising:
   means, positioned along said path, for modulating such radiation to provide a radiation signal of frequency proportional to the actual rate of radiation scan along said path;
   means for converting said radiation signal to a first electrical signal having a parameter that is proportional to the frequency of said radiation signal;
   means for providing an electrical reference signal having a parameter which is comparable with said parameter of said first signal and which is representative of the precise rate of scan desired;
   means for comparing said reference signal and said first signal and providing a correction signal proportional to the deviation of the actual scanning movement of said deflecting member from the desired scanning movement of said deflecting member; and
   means for combining said correction signal with said main primary drive signal to adjust the actual scanning movement of said deflecting member.

2. The invention defined in claim 1 wherein said modulating means is an optical grating located to intercept a portion of said radiation beam during its scanning movement.

3. In combination with a galvanometer of the type having a movable mirror and means for moving said mirror to effect scanning of a received light beam in response to an electrical signal, improved apparatus for controlling said moving means comprising:
   grating means, having a plurality of spaced markings and being disposed coextensive with at least a portion of the scanning path of such light beam, for modulating the light in such a beam in accordance with said spacings between said markings and the rate of movement of said mirror to produce a light signal of frequency proportional to the rate of scan;
   light responsive means, disposed to receive said modulated light, for producing an electrical rate of scan signal having a frequency proportional to the frequency of said light signal;
   means, operatively connected to said light responsive means, for producing a second electrical signal having a magnitude proportional to the frequency of said rate of scan signal; and
   means, operatively connected to said moving means and responsive to said second electrical signal, for producing a third electrical signal for controlling the movement of said mirror,
wherein said third electrical signal producing means comprises:
   means for generating a main reference signal;
   means for generating a supplemental reference signal;
   means, operably connected to said second signal producing means and said supplemental reference signal generating means, for comparing those signals and producing a correction signal; and
   means for combining said correction signal and said main reference signal to produce said third signal.

* * * * *